US007227183B2

(12) United States Patent
Donze et al.

(10) Patent No.: US 7,227,183 B2
(45) Date of Patent: Jun. 5, 2007

(54) POLYSILICON CONDUCTOR WIDTH MEASUREMENT FOR 3-DIMENSIONAL FETS

(75) Inventors: Richard Lee Donze, Rochester, MN (US); William Paul Hovis, Rochester, MN (US); Terrance Wayne Kueper, Rochester, MN (US); John Edward Sheets, II, Zumbrota, MN (US); Jon Robert Tetzloff, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 327 days.

(21) Appl. No.: 10/944,622

(22) Filed: Sep. 17, 2004

(65) Prior Publication Data

US 2006/0063317 A1    Mar. 23, 2006

(51) Int. Cl.
*H01L 21/66* (2006.01)
(52) U.S. Cl. .................. 257/48; 257/308; 257/21.014; 438/176; 438/283; 438/157
(58) Field of Classification Search .................. 257/48, 257/308, E21.014; 438/176, 283, 157
See application file for complete search history.

(56) References Cited

U.S. PATENT DOCUMENTS

| 6,080,597 | A  | * | 6/2000  | Moon .......................... 438/17 |
| 6,548,907 | B1 | * | 4/2003  | Yamada et al. ............. 257/773 |
| 7,013,447 | B2 | * | 3/2006  | Mathew et al. ............... 716/11 |
| 2004/0065879 | A1 | * | 4/2004 | Lu et al. ........................ 257/48 |
| 2004/0113148 | A1 | * | 6/2004 | Chiou et al. ................... 257/48 |
| 2005/0094434 | A1 | * | 5/2005 | Watanabe et al. ........... 365/156 |
| 2005/0275040 | A1 | * | 12/2005 | Anderson et al. ........... 257/390 |
| 2006/0022196 | A1 | * | 2/2006 | Tone et al. .................... 257/48 |
| 2006/0131575 | A1 | * | 6/2006 | Okuno ......................... 257/48 |

\* cited by examiner

*Primary Examiner*—Eugene Lee
(74) *Attorney, Agent, or Firm*—Robert R. Williams

(57) ABSTRACT

An apparatus and method is disclosed for determining polysilicon conductor width for 3-dimensional field effect transistors (FinFETs). Two or more resistors are constructed using a topology in which polysilicon conductors are formed over a plurality of silicon "fins". A first resistor has a first line width. A second resistor has a second line width. The second line width is slightly different than the first line width. Advantageously, the first line width is equal to the nominal design width used to make FET gates in the particular semiconductor technology. Resistance measurements of the resistors and subsequent calculations using the resistance measurements are used to determine the actual polysilicon conductor width produced by the semiconductor process. A composite test structure not only allows calculation of the polysilicon conductor width, but provides proof that differences in the widths used in the calculations do not introduce objectionable etching characteristics of the polysilicon conductors.

11 Claims, 7 Drawing Sheets

POLYSILICON CONDUCTOR WIDTH MEASUREMENT FOR 3-DIMENSIONAL FETS

BACKGROUND OF THE INVENTION

1. Field of the Invention

The current invention generally relates to semiconductor products. More specifically, the present invention relates to making electrical resistance measurements that allow accurate measurement of the width of polysilicon conductors used in making FET (field effect transistor) gates in a FinFET semiconductor process.

2. Description of the Related Art

Field Effect Transistors (FETs) have been the dominant semiconductor technology used to make Application Specific Integrated Circuit (ASIC) chips, microprocessor chips, Static Random Access Memory (SRAM) chips, and the like for many years. In particular, Complementary Metal Oxide Semiconductor (CMOS) technology has dominated the semiconductor process industry for a number of years.

Technology advances have scaled FETs on semiconductor chips to increasingly small dimensions, allowing power per logic gate to be dramatically reduced, and further allowing a very large number of FETs to be fabricated on a single semiconductor chip. Scaling of FETs is currently running into limits. Gate oxides have become thin enough that leakage occurs through the gate oxides. Further scaling of gate oxide thickness will bring an exponential increase in leakage. Power dissipated by leakage currents has become a significant portion of total chip power, and an exponential increase in leakage results in unacceptable power dissipation for many types of chips.

Silicon on Insulator (SOI) processes have reduced FET source and drain capacitances, resulting in an improved power/performance ratio for CMOS chips fabricated in an SOI process. However, conventional SOI processes are reaching fundamental limits, resulting in undesirable effects such as the leakage effects mentioned above. Therefore, innovative new ways to make CMOS devices are being created. Associated apparatus and methods are also needed to test the innovative devices at various steps in the process of making them.

A conventional SOI FET is shown in FIG. 1A. A P− substrate 3 is provided. A buried oxide (BOX) 2 is created in the P− substrate using means such as oxygen implanting. Circuit elements are formed in a silicon layer above buried oxide 2, for example forming source 5, drain 6, and body 7. Source 5 and drain 6 are doped N+ for N channel Field Effect Transistors (NFETs) and P+ for P channel Field Effect Transistors (PFETs). Body 7 is typically P− doped for NFETs and N− doped for PFETs. Oxide 4 is a thin dielectric layer of oxide (or other suitable material). Gate 8 is typically formed of polysilicon. A wide variety of process techniques are used to improve such conventional FETs. For example, often the polysilicon gate 8, source 5, and drain 6 have silicide formed on them to enhance conductivity. Fundamentally, however, the polysilicon gate is planar and maintains a substantially uniform thickness and width throughout a length of the polysilicon shape of the gate. This uniform thickness and width of the polysilicon shape allows easy determination of the actual width of the gate on a semiconductor chip. Since the polysilicon width serves as a mask when implanting source/drain regions such as source 5 and drain 6, the polysilicon width determines the effective length of the FET produced by the polysilicon width. Process engineers find it useful to place a test structure on a semiconductor chip that allows easy determination of the particular polysilicon width (effective length of the FET) that can be used at various stages in the processing of the semiconductor chip.

FIG. 1B shows a prior art figure of a structure often placed on a semiconductor chip that allows easy determination of the width of a particular polysilicon conductor in a particular chip as fabricated. Note that polysilicon conductor width, like any process parameter, varies from one batch of semiconductor chips being made to another. Polysilicon conductor 12 is used to make a first resistor RA having a first contact 11A and a second contact 11B. Polysilicon conductor 12 is further used to make a second resistor RB, having a first contact 11B and a second contact 11C. Contact 11B is conveniently used for both the second contact of Resistor RA and the first contact of resistor RB in the example structure. Resistor RB comprises one or more fingers 13, each designed to be Leff units wide (arbitrary units). Leff is used to denote a desired channel length for FETs on the semiconductor chip. Other choices than the desired channel lengths for FETs on the semiconductor chip are possible, but typically the channel length is used. Polysilicon conductor width is the primary determinant of FET channel lengths on a semiconductor chip.

Resistor RA is simply a rectangle of polysilicon having a width "W" and a length "L". The Sheet resistance of polysilicon conductor 12 is Rs ohms/square. Therefore, $$RA=Rs*L/W \quad (1)$$

Similarly, resistor RB is designed with a length of L (other lengths are possible, but L is a convenient dimension for resistor RB as well as resistor RA. Resistor RB, in the illustrative FIG. 1B is shown to have six fingers 13 connected in parallel, each having a width of "Leff". Therefore, $$RB=\frac{1}{6}*Rs*L/Leff \quad (2)$$

Rs is "unknown" (without measurement of further test structures to determine the sheet resistivity of the polysilicon), but is the same for both resistors RA and RB on any particular semiconductor chip. Resistors RA and RB are readily measured for resistance values by suitable resistance measurements through contacts 11A, 11B, and 11C.

$$Rs=RA*W/L \text{ (rearranging (1))} \quad (3)$$

$$Leff=Rs*L/(6*RB); \text{ (rearranging (2)); then, using Rs from (3) in (4),} \quad (4)$$

$$Leff=RA*W/(6*RB) \quad (5)$$

Note that the use of L1 for both resistors RA and RB conveniently eliminated L in the final equation. W still remains, and varies slightly from semiconductor chip to another semiconductor chip due to process variations, but W is made large enough that the process variations in W for a particular chip will have an insignificant effect on the determination of Leff.

Although only six fingers 13 are shown in FIG. 1B, such test structures have been constructed with differing (and usually many more than six) numbers of fingers 13.

The test structure and method of Leff determination described work very well when the polysilicon line has a substantially constant thickness.

Prior art FIGS. 2A and 2B show isometric views of a FinFET. A tall, thin fin 20 (referenced in FIG. 2B) of silicon material suitable for doping as source and drain regions rises from an oxide 19. Polysilicon gate 18 is a polysilicon conductor that surrounds fin 20 on three sides. In regions where the silicon material is doped P−, source 15 and drain 16 are subsequently doped to become N+ regions, with the P− region under gate 18 serving as a body 17 of the FinFET (body 17 shown in FIG. 2B). A thin gate oxide 14 separates polysilicon gate 18 from body 17. FinFETs have significant advantages, being "three dimensional" FETs, the gate can induce conducting channels on three sides, increasing current flow through a conducting FET, and making it less necessary that the gate oxide 14 be as thin as gate oxide 4 shown in FIG. 1A.

FIG. 2C shows an illustrative side view of polysilicon gate 18 as it goes over the tall, thin fin 20 at body 17. Although the polysilicon gate 18 has a thickness T1 when over a relatively wide region of oxide 19, gate 18 is much thinner at T2 and T3. The nonuniform thickness of polysilicon gate 18 as it goes over the "fins" renders the prior art test structure and method described above relatively ineffective in determining a channel length of a FinFET.

Therefore, there is a need for a method and apparatus that allow easy and accurate determination of channel length of a FinFET using resistance measurements.

SUMMARY OF THE INVENTION

The current invention teaches a test structure for easily determining the finished width of a polysilicon conductor (and therefore the FET channel length defined by the polysilicon conductor width) that serves as a gate electrode of a FinFET, a three dimensional field effect transistor. The finished width of a polysilicon conductor is the finished width of the polysilicon conductor after completion of processing the polysilicon conductor in a semiconductor process.

In an apparatus embodiment of the invention, two or more resistors are formed, each resistor having two contacts that allow resistive measurements to be taken. Each of the two or more resistors is routed over one or more semiconductor (typically silicon) "fins", in a direction substantially orthogonal to the direction of the fins as viewed from the top. Each of the two or more resistors is constructed with one or more fingers of the polysilicon conductor. A first of the two or more resistors is designed with fingers of a first width of the polysilicon conductor. A second of the two or more resistors is designed with fingers of a second width, with a known, but slight, difference from the first width. In embodiments shown and described, a third resistor is implemented. The third resistor is designed with fingers of a third width, the third width slightly different from both the first width and the second width. Calculations made using measured resistance of each of the resistors determine the widths of the fingers in the resistors. Those skilled in the art will understand that table lookup or other suitable techniques could also be used, instead of a calculation, to determine the widths of the fingers, using the resistance of each of the resistors. Advantageously, the first width is designed to be equal to the nominal width of polysilicon conductors used to make FET gates on the semiconductor chip, therefore providing the value of the effective channel length for FETs on a particular chip made in a semiconductor process, since polysilicon conductor width is the primary determinant of the effective channel length of an FET. Those skilled in the art will recognize that although two resistors suffice to make a determination of the polysilicon conductor width, accuracy is improved by implementing more than two resistors.

A method embodiment of the invention includes the steps of making a plurality of "fins" suitable for making FinFET transistors; making two or more resistors of polysilicon, each of the resistors comprising one or more polysilicon fingers; each of the resistors configured to travel over the plurality of fins in a direction substantially orthogonal to the fins as viewed from the top; each resistor having polysilicon fingers of different width. The method continues with the steps of measuring a resistance of each of the two or more resistors, and computing the width of the polysilicon fingers, using the resistances measured. The step of measuring the resistance can be done prior to forming a silicide on the polysilicon fingers or after forming a silicide on the polysilicon fingers.

DETAILED DESCRIPTION OF THE PREFERRED EMBODIMENTS

Figure 1A:
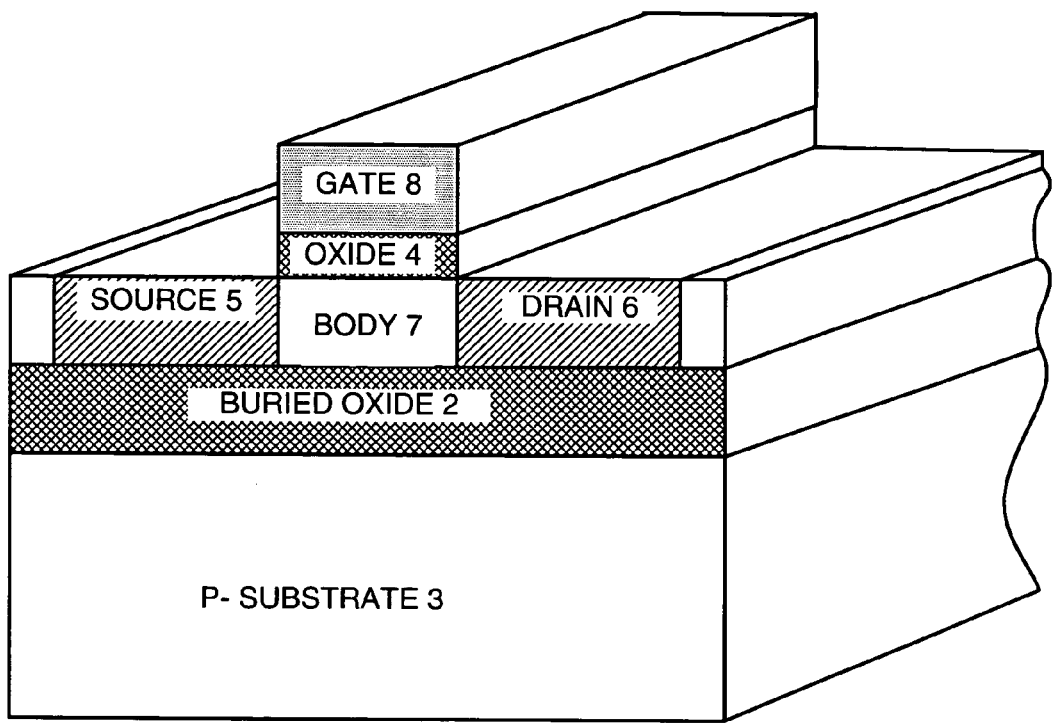
FIG. 1A is a prior art drawing that shows a simplified isometric view of a conventional silicon on insulator (SOI) field effect transistor (FET).
Figure 1B:
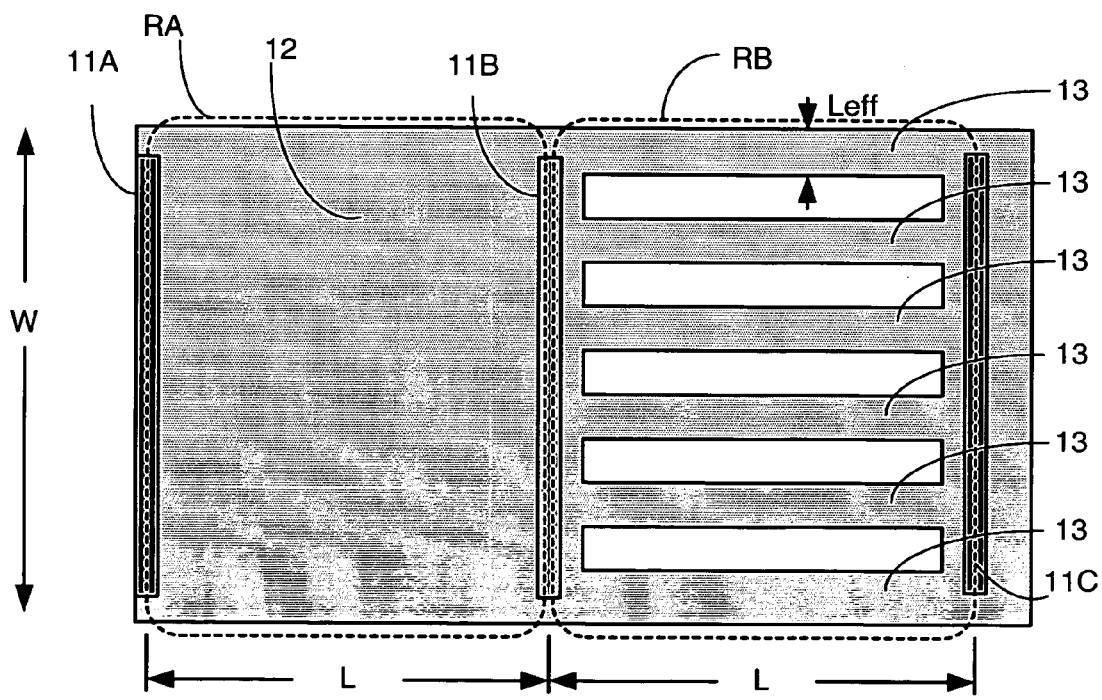
FIG. 1B is a prior art drawing that shows an illustrative layout of a test structure suitable for determining an effective channel length on a particular semiconductor chip by making resistive measurements.

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches a test structure apparatus that provides for easily determining a processed width of a polysilicon conductor that travels over one or more semiconductor "fins" on a FinFET semiconductor chip. A processed width is a final width of the polysilicon conductor after completion of a polysilicon etching step in a semiconductor process. The one or more semiconductor fins rise from a dielectric surface on the semiconductor chip. Although fins are typically higher than they are wide, the present invention is not limited to any particular height to width ratio.

In an embodiment, two or more resistors are formed, each resistor having two contacts that allow resistive measurements to be taken. Two resistors are required in the method and apparatus described below. Additional resistors allow improved accuracy in determination of the width of the polysilicon conductors. The resistors are routed over the fins, substantially orthogonally to the fins as viewed from the top.

Three resistors are used for exemplary purposes in the following description, but any number of resistors where the number is two or more is contemplated.

Each of the three resistors is routed, at least in part, over one or more silicon "fins", substantially orthogonally to the fins as viewed from the top; i.e., looking perpendicularly down toward the dielectric surface. Each of the three resistors is constructed with one or more polysilicon conductor fingers. A first of the three resistors is designed with one or more fingers of a first width of the polysilicon conductor. A second of the three resistors is designed with one or more fingers of a second width, the second width slightly different from the first width. A third of the three resistors is designed with one or more fingers of a third width, the third width slightly different from both the first width and the second width. Calculations made using measured resistance of each of the three resistors and the known slight differences in widths determine the widths of the fingers in the three resistors. Those skilled in the art will understand that table lookup or other techniques employing the measured resistance of each of the three resistors and the known slight differences in widths can also be used in determining the widths of the fingers in the three resistors.

Advantageously, the first width is designed to be equal to the typical designed width of polysilicon conductors used to make FET gates electrodes on the semiconductor chip, therefore providing the value of the typical effective FET channel length for a particular chip made in a semiconductor process. Polysilicon conductor width is the primary determinant of the effective channel length in a FinFET.

Figure 2A:
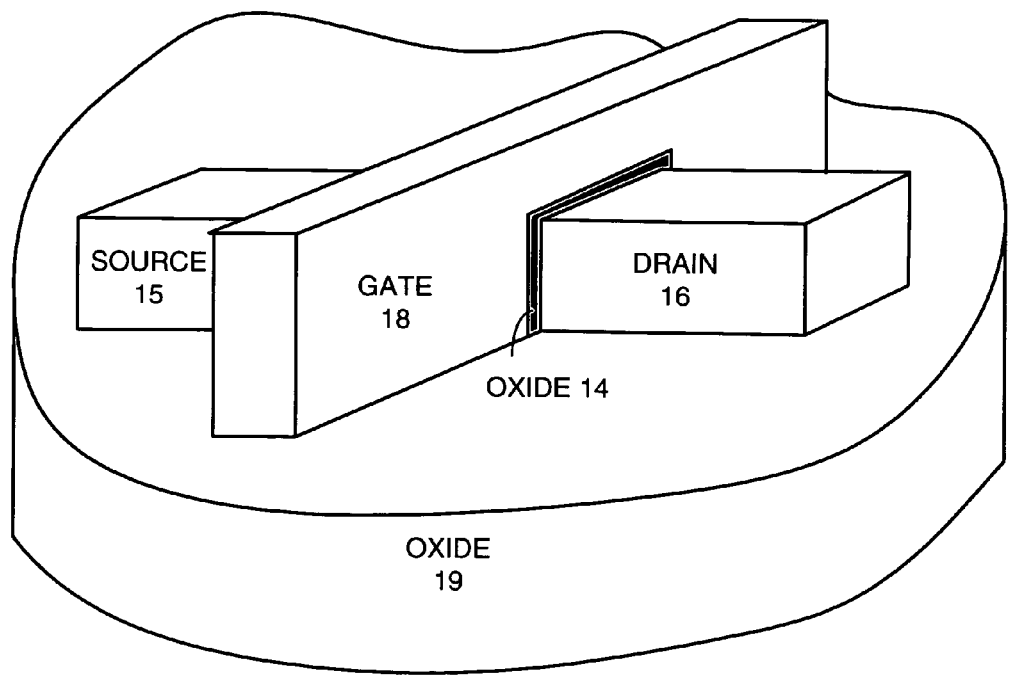
FIG. 2A is a prior art drawing that shows a simplified isometric view of a conventional FinFET, comprising a polysilicon gate covering three sides of a silicon "fin".
Figure 2B:
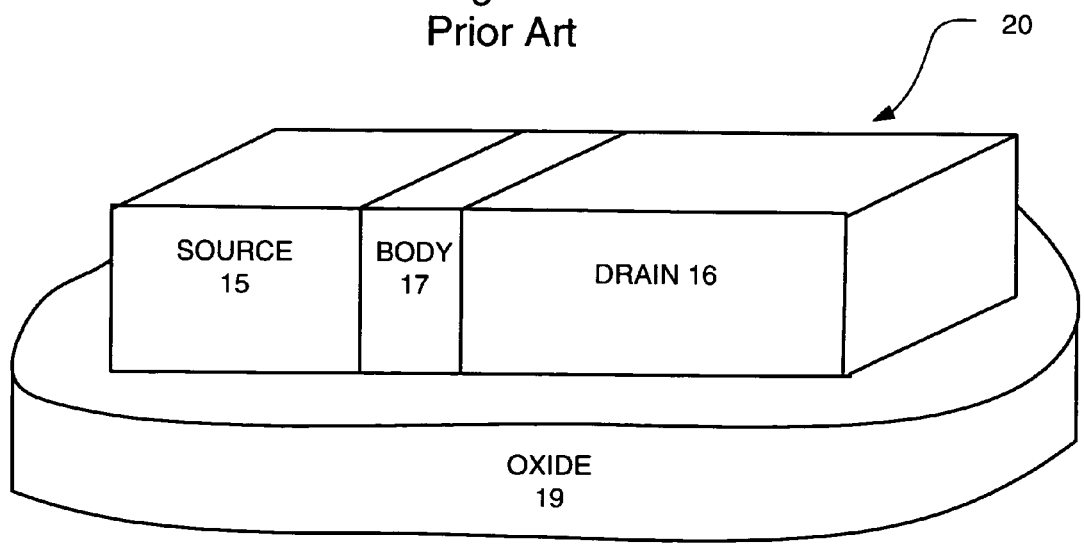
FIG. 2B is a prior art drawing that shows the "fin" of FIG. 2A with the polysilicon gate removed in order to show a body of the FET.
Figure 2C:
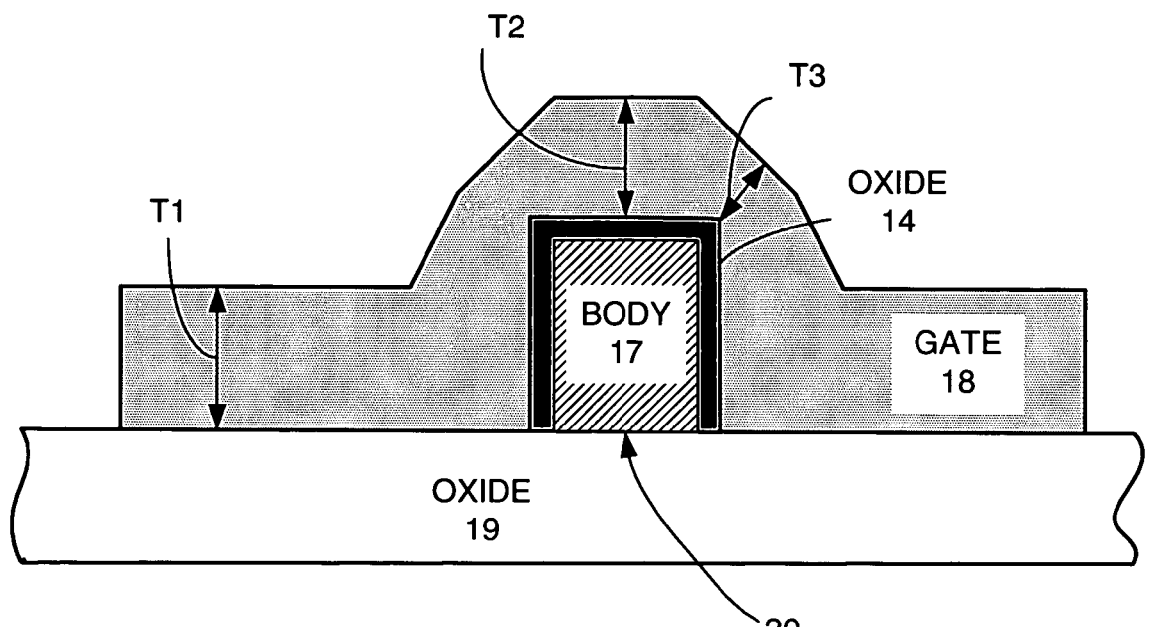
FIG. 2C is a prior art drawing that shows a cross section through the body of FIG. 2B, showing how the polysilicon gate has a thickness that is not constant as the polysilicon gate goes over the body.
Figure 3A:
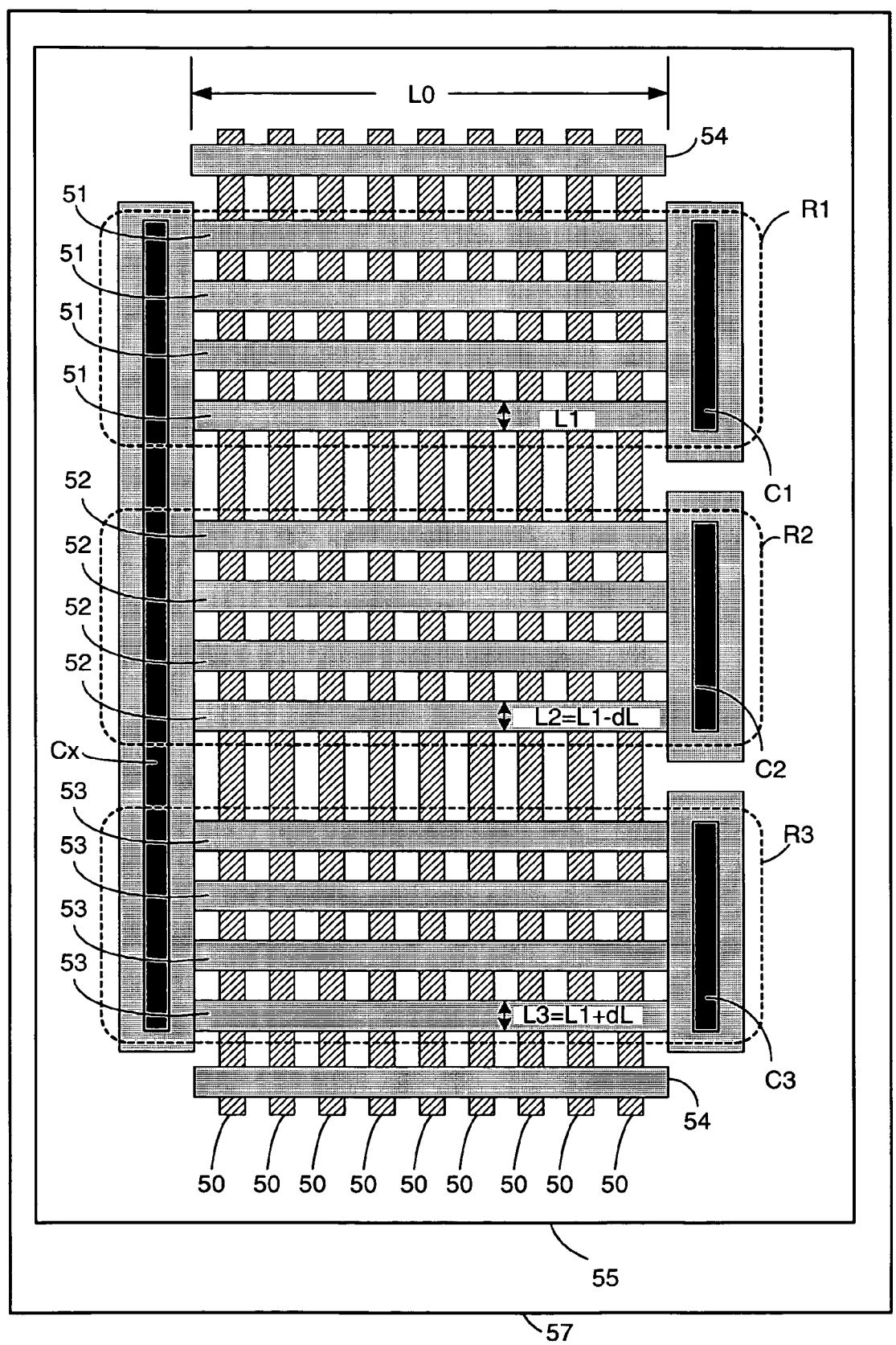
FIG. 3A shows a layout of a test structure suitable for determining an effective FinFET channel length on a particular semiconductor chip by making resistive measurements and subsequent determination of effective FinFET channel length.

Turning now to FIG. 3A, a test structure 55 is shown. One or more fins 50 of suitable semiconductor material (e.g., silicon, germanium, or other semiconductor material used to make FinFETs) material are formed on a dielectric material 57. Typically, a fin 50 is higher (i.e., extending upwards above the dielectric) than it is wide, thus earning the term "fin". However, the present invention contemplates any height to width ratio of a fin 50. Any number of fins 50 is contemplated, including only a single fin. Such fins, when used to make FinFETs become the sources (e.g., source 15 of FIG. 2B), drains, (e.g., drain 16 of FIG. 2B), and bodies (e.g., body 17 of FIG. 2B) of FinFETs on the semiconductor chip.

In a process step after the creation of fins 50, polysilicon conductors are formed orthogonal to fins 50, following the process of making FinFETs. A first resistor, R1, comprises one or more polysilicon conductors 51 (for simplicity of illustration, only one polysilicon conductor 51 is circled and referenced), each polysilicon conductor 51 having a design width L1. A design width of L1 will result in a processed width that may differ from the design width. For example, a design width L1 of 120 (measured in arbitrary units) may result in a processed width of 100. Processing tolerances may cause the processed width to vary from, for example, 80 to 120. For clarity, L1P will be used to denote the processed width of a polysilicon conductor having a design width of L1.

It is important to note that process etching of polysilicon conductors has processing tolerances, as does any manufacturing process. However, etching of polysilicon conductors affects all polysilicon conductors by substantially the same amount, rather than proportional to width of the polysilicon conductors. Therefore, if a polysilicon conductor has a design width of 100 (arbitrary units), and an etching process causes the processed width to be 95 units, a polysilicon conductor having a design width of 110 units will have a processed width to be 105 units; that is, both the 100 unit and the 110 unit polysilicon conductor were reduced by a particular pass through the etching process by 5 units. That is, L1+dL ("dL" represents a small difference in width added to design width L1) results in a processed width of L1P+dL. Polysilicon conductors of extremely disparate widths may have slightly different etching characteristics, and a maximum design width difference parameter is introduced later to ensure that the dL values do not introduce substantially different etching characteristics.

A contact C1 is provided at a first end of R1. A contact Cx is provided at a second end of R1. Resistance of R1 can be made by conventional resistance measurement means coupled to contacts C1 and Cx.

A second resistor, R2, comprises one or more polysilicon conductors 52, each polysilicon conductor 52 having a design width, L2=L1−dL. dL is intended to denote a small width difference that does not introduce unacceptable width dependent "second order" polysilicon etching effects. For example, a very wide polysilicon conductor may have significantly different etch characteristics than a typical narrow polysilicon conductor used to make FinFET gate electrodes. Discussion of a maximum design width difference will be given later. In the example, design width L2 is designed to be slightly narrower than the design width L1. A contact C2 is provided at a first end of R2. Contact Cx is provided at a second end of R2. Although a single contact Cx is shown for simplicity of illustration, those skilled in the art will appreciate that separate contacts could be used instead of a single contact. When a resistive measurement is made of R2, the probe of the ohmmeter (or other suitable resistance measuring technique, such as "force a current; measure a voltage") at second end of R2 should be placed on a portion of contact Cx at the second end of R2.

If resistance measurement is made later in the process, when metal (aluminum, copper, or other suitable low resistance conductor) couples contacts Cx, C1, C2, and C3, resistance measurements can be made at probe points further away, subject to constraints of known resistance measurement techniques, or even be made electronically by resistance measurement circuitry on the chip (not shown).

Etching of polysilicon conductors is affected by absence or presence of other polysilicon conductors nearby. A polysilicon conductor of a particular design width having no nearby other polysilicon conductors will have a processed width narrower than a polysilicon conductor of the same particular design width but having other polysilicon conductors nearby. Dummy polysilicon conductors 54 are shown in test structure 55 to ensure that all polysilicon conductor fingers in resistors R1, R2, R3 have polysilicon conductor "neighbors". More than one polysilicon conductor 54 maybe implemented if needed to ensure that all polysilicon conductor fingers in resistors R1, R2, R3 have similar etching properties. Dummy polysilicon conductors 54 are optional if other circuitry nearby provides polysilicon conductors. Although, for simplicity, dummy polysilicon conductors 54 are shown having no contacts, in general, one or more contacts would be provided, with the contacts coupling dummy polysilicon conductors 54 to a voltage supply. Note that although resistors R1, R2, and R3 are shown be slightly separated for easy identification of the resistors (i.e., having a gap between the nearest polysilicon conductors of resistors R1 and R2, or the nearest polysilicon conductors of resistors R2 and R3), advantageously, all the polysilicon conductors (including dummy polysilicon conductors 54) shown are equally spaced to ensure similar etching of the polysilicon conductors.

Figure 4:
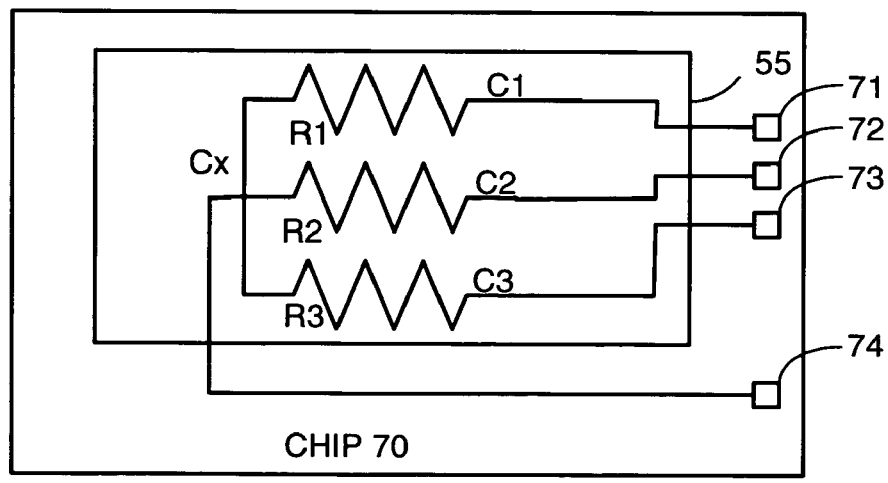
FIG. 4 shows a semiconductor chip with signals routed from the test structure to chip I/O pins.

In an embodiment illustrated in FIG. 4 wherein contacts Cx, C1, C2, and C3 are coupled with metal, the metal can be routed to I/O pins 71, 72, 73, 74 for measurement even after a semiconductor chip 70 is completely through processing, as shown in FIG. 4. I/O pins 71, 72, 73, 74, in various embodiments, are solder ball connectors, wirebond connectors, or any other mechanism used to interconnect semiconductor chip 70 to the next level of packaging (module, printed wiring board, or other packaging upon which semiconductor chip is mounted).

Similarly, a third resistor, R3, comprises one or more polysilicon conductors 53, each polysilicon conductor 53 having a design width L3=L1+dL. In the example, design width L3 is designed to be slightly wider than the design width L1. A contact C3 is provided at a first end of R3. Contact Cx is shown to contact a second end of R3.

The above exemplary design widths of R1, R2, and R3 are illustrative only. For example, if design width L2 could be designed to be slightly larger than the design width L1 (i.e., L2=L1+dL), and the design width L3 could be designed to be slightly larger than design width L2 (i.e., L3=L2+dL).

Equations for the values of R1, R2, and R3 shown in FIG. 3A are given below in equations (1), (2), and (3). "N" represents the number of fingers in each of resistors R1, R2, R3; in the example shown in FIG. 3A, N=4. Construction of resistors R1, R2, and R3 having the same length (i.e., L0), and the same number of fingers simplifies the math, although differing lengths and number of fingers is contemplated. Calculation of the processed width of the polysilicon shape of design width L1 is shown below in equations (4) and (5). As stated earlier, the invention is not limited to "calculations", and table lookup or other techniques used in determining L1P are contemplated.

$$R1 = Rs*L0/L1P/N \quad (1)$$

$$R2 = Rs*L0/(L1P-dL)/N \quad (2)$$

$$R3 = Rs*L0/(L1P+dL)/N \quad (3)$$

From (1) and (2), $$L1P = R2*dL/(R2-R1) \quad (4)$$

From (1) and (3), $$L1P = R3*dL/(R1-R3) \quad (5)$$

The resistances of R1, R2, and R3 are measured resistances, as described above, and are therefore known. dL, as described above, is a small design perturbation in design width of the polysilicon conductor fingers in R2 and R3 versus R1 as described earlier, and is therefore also known. Therefore, L1P, the processed width of the fingers 51 of R1 is as calculated in (4) and (5).

It will be understood that either (4) or (5) provides a calculated value of the processed width L1P, and therefore only two resistors (i.e., R1 and R2; R1 and R3; R2 and R3) are required, improved confidence and accuracy in determination of L1P is achieved by having more than two resistors.

Figure 3B:
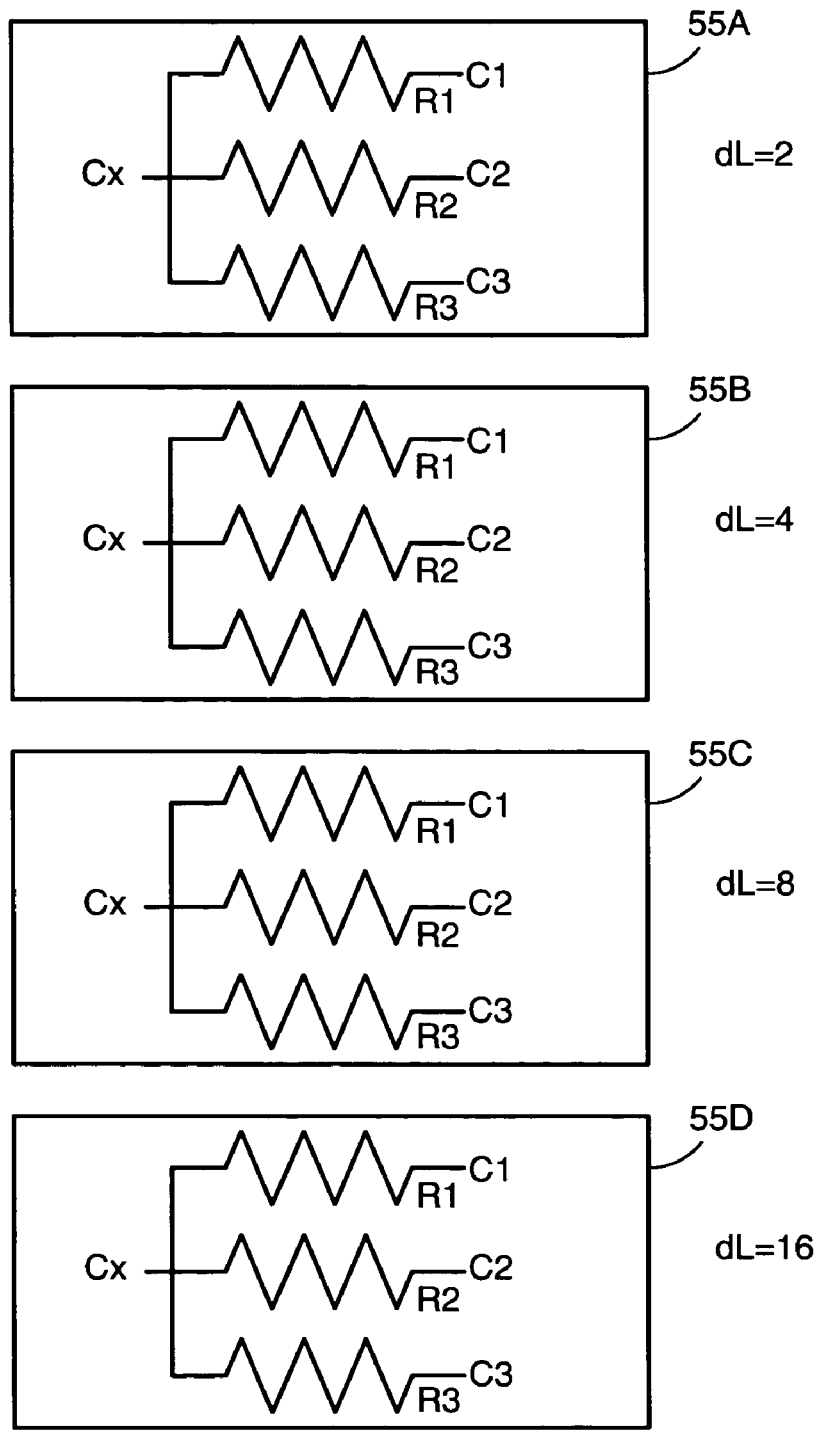
FIG. 3B shows multiple instances of the test structure of FIG. 3A as a composite test structure, each instance having differing perturbations in polysilicon conductor width. The composite test structure is used to investigate polysilicon etch effects versus polysilicon design width.

It will also be understood that different values of dL can be used to ensure that etching properties of the polysilicon conductor are not adversely affecting the determination of L1P. FIG. 3B shows an etching test structure 60 having multiple instances of test structure 55, each instance having a different perturbation of silicon conductor width. For example, (again assuming an arbitrary unit of width) suppose, for simplicity that the design width of L1 is 100. An array of dL's are chosen: $dL_1=2$; $dL_2=4$; $dL_3=8$; $dL_4=16$. Etching test structure 60 includes four instances of test structure 55 described above (i.e., two or more resistors each resistor comprising one or more fingers) is constructed (test structures 55A, 55B, 55C, 55D illustrated in FIG. 3B), each instance having one of the four dL's just described (i.e., 2, 4, 8, and 16). For simplicity of illustration, each resistor R1, R2, R3 is shown schematically in FIG. 3B. Resistors R1, R2, R3 in each of the instances are measured, and L1P is computed for each instance. If L1P is computed as having the same width in each, the designer is confident that the etching properties of the polysilicon conductor have not been affected by any perturbation (dL's) of widths of polysilicon conductors used in etching test structure 60. Suppose, however, that, for $dL_1$ (from instance 55A) and $dL_2$ (from instance 55B) an actual calculated processed width of L1P is calculated to be 101 (i.e., the processed width is one unit larger than the design width of 100); for $dL_3$, (from instance 55C) the actual calculated processed width of L1P is 101.5; and for $dL_4$, (from instance 55D) the actual calculated processed width of L1P is 103, the designer knows that perturbations of eight, and in particular, sixteen, units affect the etching process differently than for smaller perturbations and should not be used. Based on a predetermined accuracy specification determined by the designer, a maximum design width difference is determined. Design widths differences less than the maximum design width difference are determined by the above process to have similar polysilicon etch properties. Design widths having greater than the maximum design width difference have polysilicon etch properties different enough that an estimated calculation of the processed width of L1P (the polysilicon width of the finger width of R1) exceeds an accuracy requirement determined by the designer. In the above example, the designer might accept that test structure 53C provides an estimate of the processed width of L1P is 101.5, whereas test structures 53A and 53B provide the processed width of L1P as 101 (i.e., a 0.5 unit difference). If larger discrepancies in the estimate of the processed width of L1P are unacceptable to the designer, the designer would determine that a design width difference of $dL_3$ is the maximum design width difference. Any number of instances of test structure 55 implemented in an etching test structure is contemplated.

Figure 3C:
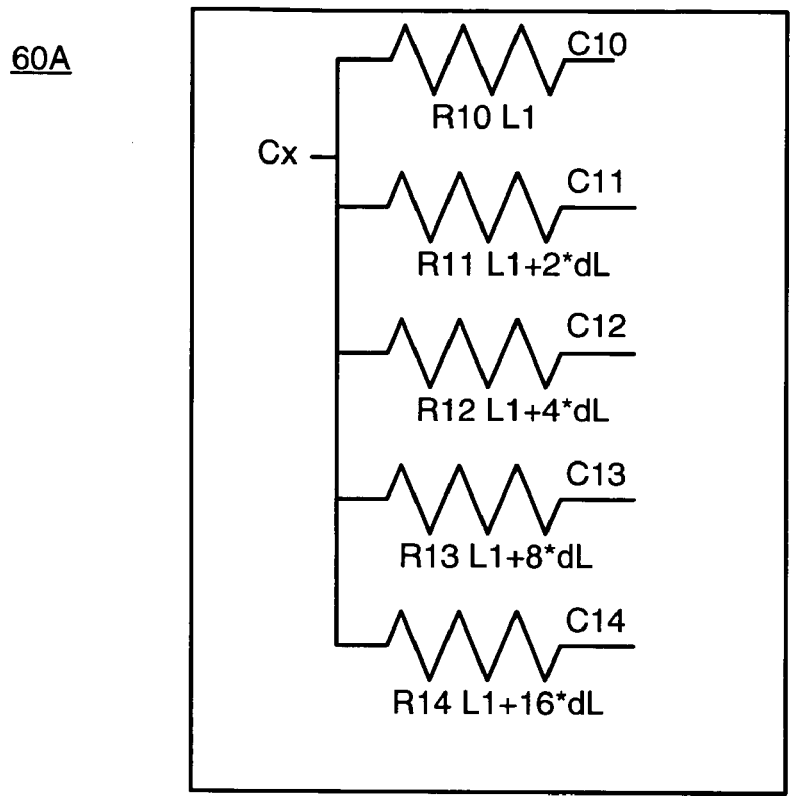
FIG. 3C shows a merged composite test structure having a wide range of polysilicon conductor widths to investigate polysilicon etch effects versus polysilicon design width.

Those skilled in the art will understand that the etching test structure described above can also be embodied as an etching test structure having more resistors of increasing perturbation in a single test structure. Etching test structure 60A, as shown in FIG. 3C, shows such a composite test structure embodiment. Resistor R10 has a design width of L1; resistor R11 has a design width of L1+2*dL; resistor R12 has a design width of L1+4*dL; resistor R13 has a design width of L1+8*dL; and resistor R14 has a design width of L1+16*dL. Resistors R10, R11, R12, R13, and R14 are constructed in the same manner as R1, R2, R3; that is, constructed of one or more fingers of polysilicon that are routed, at least in part, over one or more fins on a semiconductor chip. Contact Cx is a common contact to a first end of all resistors (R10, R11, R12, R13, and R14) as described before. Separate contacts to the first end of all resistors are contemplated. Second ends of R10, R11, R12, R13, and R14 are coupled to contacts C10, C11, C12, C13, and C14, respectively. R10 is a polysilicon resistor having one or more polysilicon fingers of design width L1, the polysilicon fingers routed, at least in part, over one or more silicon fins. R11 is designed like R10, but with a design width of polysilicon fingers L1+2*dL. R12 is designed like R10, but with a design width of polysilicon fingers L1+4*dL. R13 is designed like R10, but with a design width of polysilicon fingers L1+8*dL. R14 is designed like R10, but with a design width of polysilicon fingers L1+16*dL. Any number of resistors is contemplated.

As with composite test structure 60, composite test structure 60A provides the designer the ability to ensure that width related polysilicon etching effects are not affecting the calculation of L1P, the processed width of a polysilicon finger having a design width L1. As with test structure 55, dummy polysilicon conductors 54 should be added where required to ensure that all polysilicon fingers in resistors R10, R11, R12, R13, and R14 have a nearby polysilicon conductor.

Figure 5:
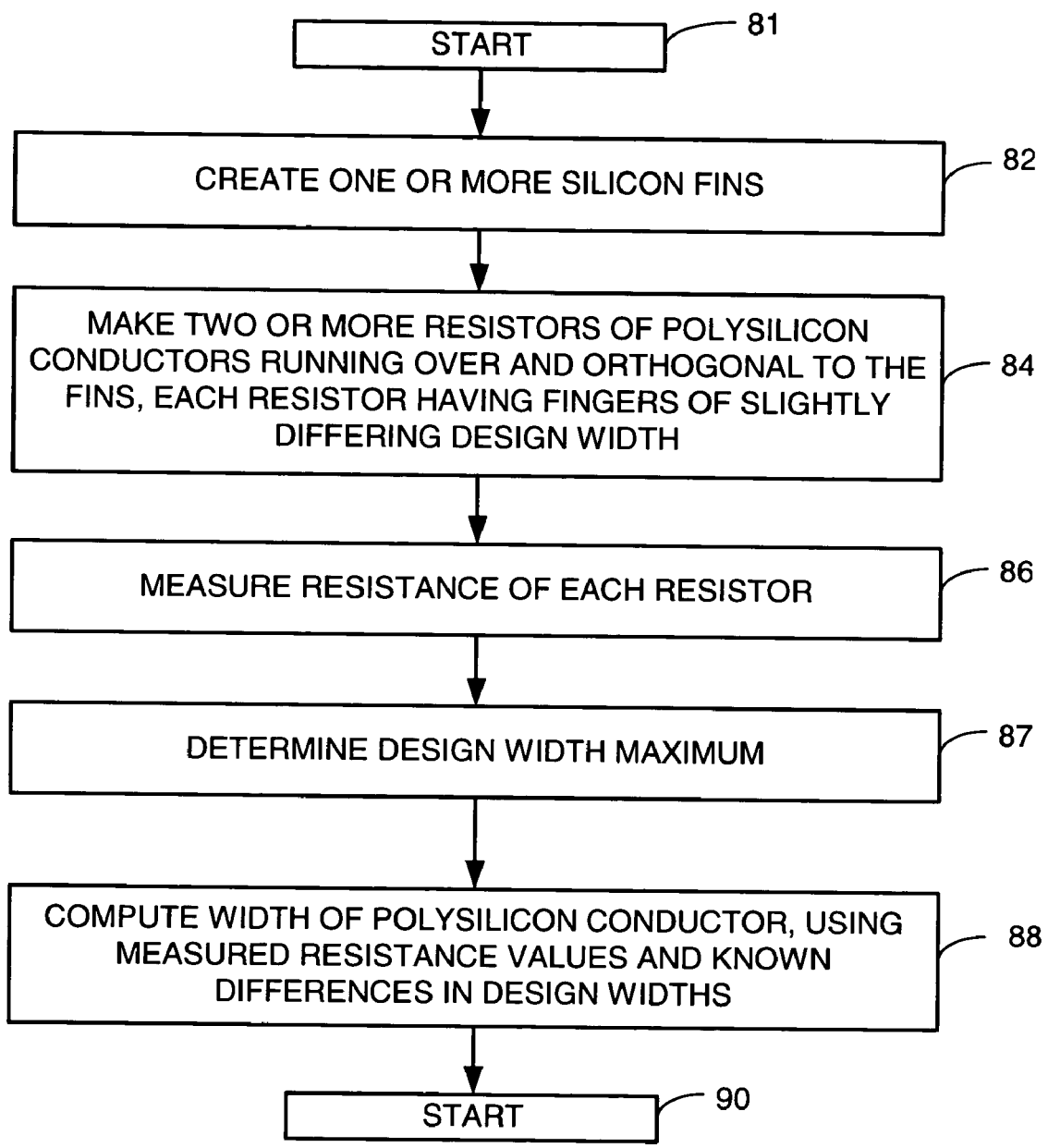
FIG. 5 shows an exemplary flowchart of a method for determining width of a polysilicon conductor, using two or more polysilicon resistors of different widths.

A method embodiment of the invention is illustrated as a flowchart in FIG. 5. Method 80 starts at step 81. In step 82, one or more silicon fins are formed on a dielectric, the silicon fins suitable for drain, source, and body areas of FinFETs. In step 84, two or more resistors, each resistor having one or more fingers of polysilicon conductor, are formed orthogonal to and running over the fins. Each resistor is constructed of polysilicon conductors having a slightly different design width than the polysilicon conductors in other resistors. In step 86, each resistor is measured for resistance value (for example, number of ohms). In optional step 87, a maximum design width difference is determined to ensure that design widths used (e.g., perturbations in width) do not affect the etching properties of the polysilicon conductor width beyond a predetermined amount. If the maximum design width difference is known for a particular semiconductor process from other testing and experimentation, step 87 can be eliminated, with perturbations in design width set equal to or less than the maximum design width difference. In step 88, the width of at least one polysilicon conductor is calculated, using the measured resistance values and the known differences in design widths of the polysilicon conductors. Calculations performed are as taught previously in equations (4) and (5). Step 90 ends the method.

What is claimed is:

1. A test structure suitable for determining a finished width of a polysilicon conductor routed over fins of a FinFET comprising:
   one or more silicon fins constructed on a silicon chip;
   a first resistor having one or more polysilicon fingers of a first design width, the first resistor routed orthogonal to and, at least in part, over the one or more silicon fins; and a second resistor having one or more polysilicon fingers of a second design width, the second resistor routed substantially orthogonal to and, at least in part, over the one or more silicon fins;
   wherein a difference between the first design width and the second design width is small enough that etching properties of the polysilicon fingers of the first resistor are substantially the same as the etching properties of the second resistor.

2. The test structure of claim 1, further comprising:
   a third resistor having one or more polysilicon fingers of a third design width, the third resistor routed orthogonal to and, at least in part, over the one or more silicon fins;
   wherein a difference between the first design width and the second design width is small enough that etching properties of the polysilicon fingers of the first resistor are substantially the same as the etching properties of the third resistor.

3. The test structure of claim 2, wherein the design width of the second resistor is smaller than the design width of the first resistor, and wherein the design width of the third resistor is larger than the design width of the first resistor.

4. The test structure of claim 1, the first resistor and the second resistor having contacts suitable for probing prior to performing a silicide step in a semiconductor process.

5. The test structure of claim 1, the first resistor and the second resistor having contacts suitable for probing following a silicide step in a semiconductor process.

6. The test structure of claim 1, the first resistor and the second resistor coupled to I/O pins on the semiconductor chip.

7. The test structure of claim 1, further comprising one or more dummy polysilicon conductors near enough to the first resistor and to the second resistor to ensure uniform polysilicon etching of the one or more polysilicon fingers in the first resistor and in the second resistor.

8. An etching test structure suitable for determining a finished width of a polysilicon conductor routed over fins of a FinFET comprising:
   one or more silicon fins constructed on a silicon chip;
   a first resistor having one or more polysilicon fingers of a first design width, the first resistor routed orthogonal to and, at least in part, over the one or more silicon fins;
   a second resistor having one or more polysilicon fingers of a second design width, the second resistor routed orthogonal to and, at least in part, over the one or more silicon fins; and
   a third resistor having one or more polysilicon fingers of a third design width, the third resistor routed orthogonal to and, at least in part, over the one or more silicon fins;
   wherein the first design width, the second design width, and the third design width are used to determine that at least the first design width and the second design width are less than a maximum design width difference.

9. The etching test structure of claim 8, wherein a first difference between the first design width and the third design width is four or more times a second difference between the first design width and the second design width.

10. The etching test structure of claim 9, wherein the first difference is eight or more times the second difference.

11. The etching test structure of claim 8, further comprising one or more dummy polysilicon conductors positioned to ensure that all polysilicon fingers in the first resistor, the second resistor, and the third resistor have a nearby polysilicon conductor.

* * * * *